United States Patent [19]

Nakamura et al.

[11] Patent Number: 4,658,173
[45] Date of Patent: Apr. 14, 1987

[54] PIEZOELECTRIC VIBRATOR AND METHOD OF ADJUSTING VIBRATING FREQUENCY THEREOF

[75] Inventors: Takeshi Nakamura, Uji; Ikuo Matsumoto, Nagaokakyo, both of Japan

[73] Assignee: Murata Manufacturing Co., Ltd., Nagaokakyo, Japan

[21] Appl. No.: 798,026

[22] Filed: Nov. 14, 1985

[30] Foreign Application Priority Data

Nov. 19, 1984 [JP] Japan ................................ 59-245625

[51] Int. Cl.[4] .......................................... H01L 41/08
[52] U.S. Cl. .................................... 310/321; 310/312
[58] Field of Search ............. 310/312, 321, 323, 367, 310/368, 348, 351–353; 29/25.35

[56] References Cited

U.S. PATENT DOCUMENTS

| 2,870,521 | 1/1959 | Rudnick | 310/312 X |
| 4,469,975 | 9/1984 | Nakamura et al. | 310/353 X |
| 4,511,821 | 4/1985 | Nakamura et al. | 310/351 |
| 4,532,451 | 7/1985 | Inoue | 310/348 X |

FOREIGN PATENT DOCUMENTS 0000212  1/1984  Japan ................................... 310/312

Primary Examiner—Mark O. Budd
Attorney, Agent, or Firm—Wenderoth, Lind & Ponack

[57] ABSTRACT

The disclosure is directed to a piezoelectric vibrator or resonator which includes a vibrating plate employing expansion mode vibration, and a groove or grooves formed at a center and/or in the vicinity of the center of the vibrating plate in a direction intersecting sides of the vibrating plate contributing to the vibration so as to make vibration propagating speed slower than that in the absence of the groove or grooves, and also to a method of adjusting vibrating frequency of such a piezoelectric vibrator.

6 Claims, 3 Drawing Figures

PIEZOELECTRIC VIBRATOR AND METHOD OF ADJUSTING VIBRATING FREQUENCY THEREOF

BACKGROUND OF THE INVENTION

The present invention generally relates to a piezoelectric vibrator or resonator and more particularly, to the construction of a piezoelectric vibrator whose vibrating frequency is determined by the dimensions of a piezoelectric plate itself, and to the construction of a piezoelectric vibrator including a piezoelectric transducer and a mechanical vibrating plate, and also to a method of adjusting the vibrating frequencies of such a piezoelectric vibrator.

Conventionally, as a piezoelectric vibrator employing expansion mode vibration directed from a center towards a peripheral portion thereof, there have been mainly proposed crystal vibrators and piezoelectric ceramic vibrators. For setting the vibrating frequency of such a vibrator to a desired value, it has been a common practice to alter the peripheral lengths or the lengths of the sides by trimming off end faces of discs, rectangular or square plates, etc. or to add a mass onto the vibrating surface, but in this case, the vibrator tends to lose its balance, with a consequent adverse effect on the resonance characteristics, while adjustments thereof are difficult, requiring adjusting indices applied thereto.

By way of example, in the case where end faces of a vibrator V in the form of a square plate as shown in FIG. 1 (in which an electrode is omitted for clarity), are to be trimmed for adjustment of the vibrating frequency, four sides of the square plate may be simultaneously trimmed by the same amount, but due to poor processability in that case, sides 11 and 12 are usually trimmed the same amount in the state where 11=12. In this case, however, since a support point S is undesirably deviated from the center, it has been difficult to eliminate deterioration in the resonance characteristics or to improve accuracy in trimming. Furthermore, difficulties in measurements during the trimming obstruct improvement of the accuracy, and trimming one piece by one piece also results in the requirement of much trimming time or application of adjusting indices.

SUMMARY OF THE INVENTION

Accordingly, an essential object of the present invention is to provide a piezoelectric vibrator or resonator having a construction in which the vibrating frequency may be lowered.

Another important object of the present invention is to provide a method of adjusting or trimming vibrating frequencies in a simple and accurate manner without adversely affecting resonance characteristics.

A further object of the present invention is to provide a piezoelectric vibrator of the above described type which is simple in construction and stable in functioning, and can be manufactured on a large scale at low cost.

In accomplishing these and other objects, according to one aspect of the present invention, there is provided a piezoelectric vibrator which includes a vibrating plate employing expansion mode vibration, and a groove means formed at a center and/or in the vicinity of the center of said vibrating plate in a direction intersecting sides of said vibrating plate contributing to the vibration, thereby to make the vibration propagating speed slower than that in the absence of said groove means.

In another aspect of the present invention, there is also provided a method of adjusting the vibrating frequency of a piezoelectric vibrator which includes the steps of forming a groove means for vibrating frequency adjustment at a center and/or in the vicinity of the center of a vibrating plate of said piezoelectric vibrator in a direction intersecting sides of said vibrating plate contributing to the vibration, and making vibration propagating speed slower than that in the absence of said groove means, thereby to set the vibrating frequency at a required value.

By providing such a groove means, owing to the fact that the vibration is propagated in a direction intersecting the groove means, the propagating speed of the vibration in the direction intersecting said groove means becomes low, i.e., surface effective length contributing to the vibrating frequency becomes long, with a consequent reduction of the vibrating frequency as compared with the case without the groove means. Accordingly, the above fact is utilized for setting the vibrating frequency to the desired value.

By the arrangement according to the present invention as described above, an improved piezoelectric vibrator and a method of adjusting vibrating frequency thereof have been advantageously provided.

BRIEF DESCRIPTION OF THE DRAWINGS

These and other objects and features of the present invention will become apparent from the following description of a preferred embodiment thereof taken in conjunction with the accompanying drawings, in which.

DESCRIPTION OF THE INVENTION

Figure 1:
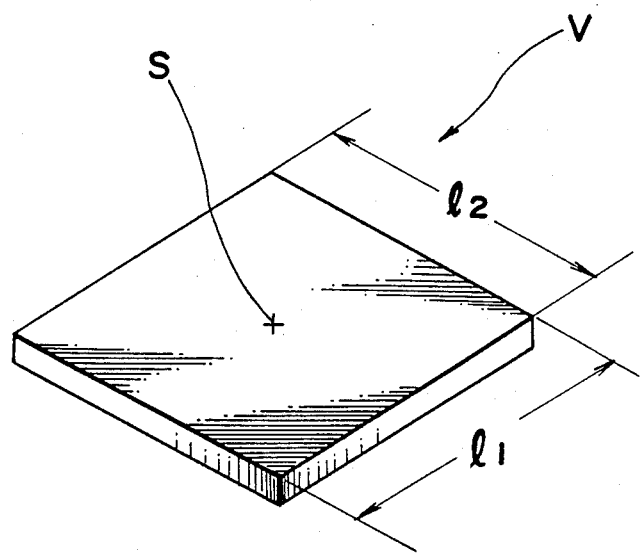
FIG. 1 is a perspective view showing a conventional piezoelectric vibrator in the form of a square plate, with an electrode thereof omitted for clarity (already referred to)

Before the description of the present invention proceeds, it is to be noted that like parts are designated by like reference numerals throughout the accompanying drawings.

Figure 2:
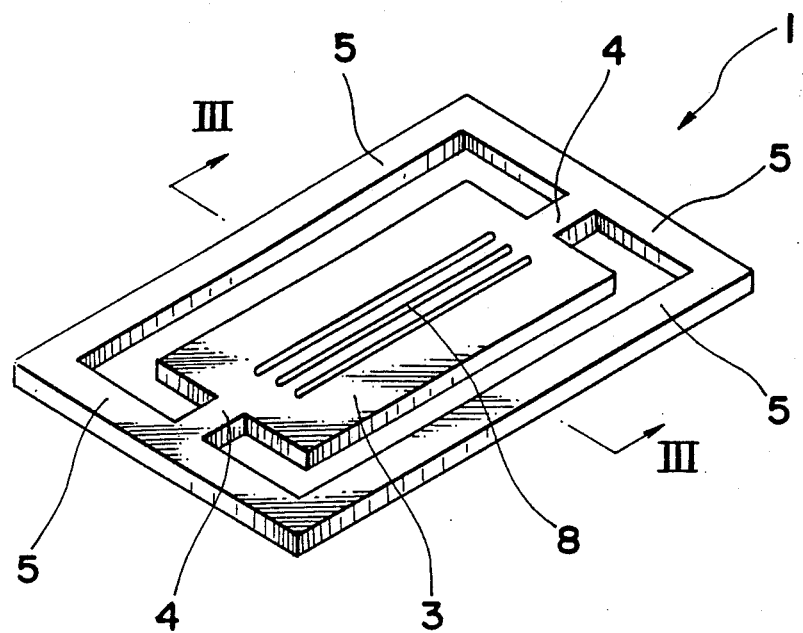
FIG. 2 is a perspective view showing a piezoelectric vibrator according to one preferred embodiment of the present invention.
Figure 3:
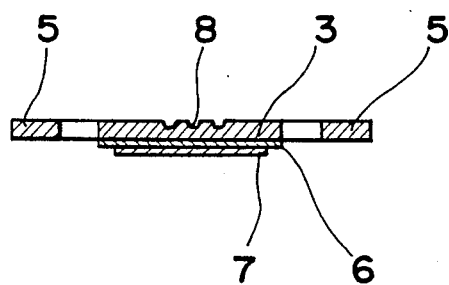
FIG. 3 is a cross section taken along the line III—III In FIG. 2.

Referring now to the drawings, there is shown in FIGS. 2 and 3 an improved piezoelectric vibrator or resonator 1 according to one preferred embodiment of the present invention, which includes a mechanical vibrating portion 3 connected to a frame 5 through connecting portions 4, all of which are integrally formed from a metallic plate of a metal having a constant modulus of elasticity such as Elinvar or the like, a piezoelectric thin film 6 of ZnO, etc., formed on one surface of the mechanical vibrating portion 3, an electrode layer 7 further formed on said piezoelectric thin film 6, and one groove or a plurality of grooves 8 which are formed on the other surface of said mechanical vibrating portion 3 where the piezoelectric thin film 6 and electrode layer 7 are not provided, so as to extend from the center of said other surface in the lengthwise direction, i.e., in the direction crossing and more preferably, intersecting at right angles with the vibrating direction to be utilized, whereby the mechanical vibration is produced by applying electrical signals between the electrode film 7 and the frame 5. In the above construction, the vibrating mode determined by the dimension in the direction of the short sides is utilized. When more than one groove 8 is required, it is preferable from the viewpoint of balancing to symmetrically provide the additional grooves along both sides of the central groove. For the formation of the grooves 8, laser trimming may be employed. By the arrangement of the present invention as described above, the effective length of the surface becomes long as compared with that in the case where no groove is provided, and thus, the propagating speed of the vibration is reduced, with a consequent lowering of the vibrating frequency.

It should be noted here that the present invention is not limited in its application to the combined structure of a mechanical vibrator and a piezoelectric transducer as in the foregoing embodiment alone, but may readily be applied to a construction in which an electrode is provided on a piezoelectric plate and the vibrating frequency is determined by the dimensions of the piezoelectric plate itself.

As is clear from the foregoing embodiment, according to the present invention, favorable effects as follows can be achieved.

(i) Since the trimming may be effected in the state where the piezoelectric vibrator is connected to a frequency measuring circuit (not particularly shown), adjustments can be made with high accuracy and in a short period of time.

(ii) Owing to the fact that the trimming is effected at the center and/or in the vicinity thereof, the vibrating balance is not readily lost.

(iii) The depth of the groove may be altered, for example, simply by changing the power of the laser, and therefore, rough adjustment or fine adjustment may be easily made selectively depending on necessity or continuous variation can be effected.

(iv) After once making rough adjustment, a groove or grooves for fine adjustment can further be formed in said groove, and thus, adjusting operations may be simplified for automation.

(v) Since the flat surface of the vibrator is utilized as the trimming portion, a plurality of piezoelectric vibrators (each including the connecting portions and frame) can be subjected to trimming while in a wafer connected through joint portions, and as compared with the conventional trimming effected one piece by one piece, whereby trimming time and operation indices can be reduced to a large extent.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A piezoelectric vibrator device comprising:
   a vibrating plate;
   piezoelectric means on said vibrating plate for vibrating said plate in the expansion mode vibration in a direction between two opposite side edges of said plate; and
   groove means in the surface of said vibrating plate other than the portion on which said vibrating means is positioned, said groove means being substantially midway between said side edges and extending perpendicular to the direction of vibration between the two opposite side edges of the plate and extending into the material of the plate for reducing the speed of propagation of the vibrations.

2. A piezoelectric vibrator device as claimed in claim 1 further comprising a frame within which said vibrating plate is positioned with the edges of the vibrating plate spaced from the inner edge of said frame, and connecting portions integrallly connecting said vibrating plate and said frame at positions other than the side edges between which the vibrations occur, said vibrating plate, said connecting portions and said frame being of a metallic material having a constant modulus of elasticity, and said vibrating means comprising a film of piezoelectric material on a surface of said vibrating plate other than the surface having said groove means therein, and an electrode layer on said thin film.

3. A piezoelectric vibrator device as claimed in claim 2 in which said groove means is a single groove.

4. A piezoelectric vibrator device as claimed in claim 2 in which said groove means is a plurality of parallel grooves.

5. A piezoelectric vibrator device as claimed in claim 4 wherein said grooves include a central groove midway between said sides between which vibrations occur, and additional grooves symmetrically positioned on opposite sides of said central groove.

6. A method of adjusting the vibrating frequency of piezoelectric vibrator device having a vibrating plate with piezoelectric means on said vibrating plate for vibrating said plate in the expansion mode vibration in a direction between two opposite side edges of said plate, said method comprising:
   forming groove means in the surface of said vibrating plate other than the portion on which said vibrating means is positioned substantially midway between said side edges and extending into the material of the plate for reducing the speed of propagation of the vibrations.

* * * * *